United States Patent [19]

Bennett et al.

[11] Patent Number: 4,552,422
[45] Date of Patent: Nov. 12, 1985

[54] MODULAR RECEPTACLE PIN GRID ARRAY

[75] Inventors: Benny M. Bennett; Robert F. Meehan, both of Harrisburg; Dale R. Zell, Elizabethtown, all of Pa.

[73] Assignee: AMP Incorporated, Harrisburg, Pa.

[21] Appl. No.: 475,268

[22] Filed: Mar. 14, 1983

[51] Int. Cl.⁴ .......................................... H01R 23/72
[52] U.S. Cl. ............................... 339/17 CF; 361/400
[58] Field of Search ............ 361/395, 380, 396, 400, 361/405, 413, 416, 426; 174/72 R, 74 R; 339/17 C, 59 M, 17 CF, 74 R, 75 M, 75 MP; 357/80, 84

[56] References Cited

U.S. PATENT DOCUMENTS 3,409,857 11/1968 O'Neill et al. .................. 339/17 CF
4,341,429 7/1982 Bright et al. ..................... 339/75 M
4,368,939 1/1983 Foederer .......................... 339/59 M Primary Examiner—A. D. Pellinen
Assistant Examiner—Gregory D. Thompson
Attorney, Agent, or Firm—Russell J. Egan

[57] ABSTRACT

A modular receptacle housing is formed by four identical housing modules of molded rigid insulative material, which modules are interlocked to form a single housing. Each housing module carries a plurality of receptacle terminals. The arrangement of modules can readily be adopted to accommodate a wide variety of pin counts and configurations.

5 Claims, 4 Drawing Figures

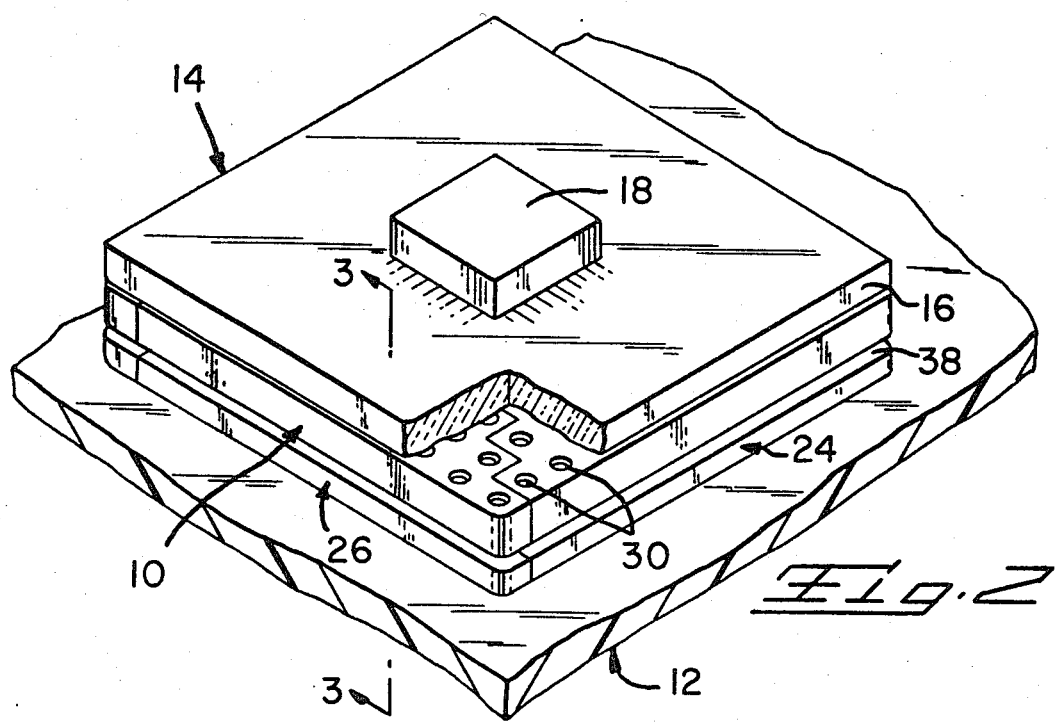
Fig. 2
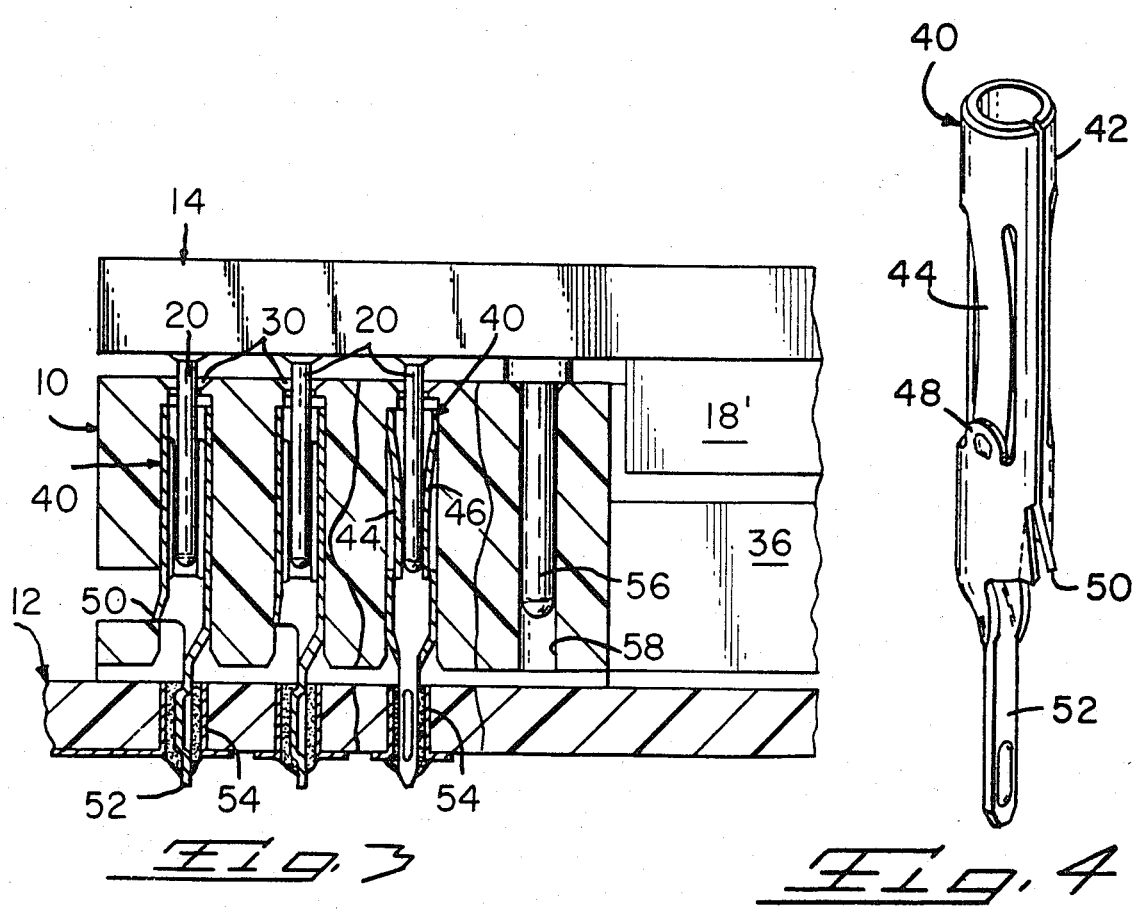
Fig. 3
Fig. 4

MODULAR RECEPTACLE PIN GRID ARRAY

BACKGROUND OF THE INVENTION

The present invention relates to a modular receptacle for high density pin grid arrays and in particular to a modular receptacle which can be readily adopted for pin arrays of different pin counts and configurations.

Since the advent of the integrated circuit chip there has been a constant problem of providing an adequate means to interface the chip with other circuitry, sometimes referred to as the outside world. The problem arises in the high number of closely spaced leads which come from the chip and which must be able to interface in a relatively high density configuration. However, the wide variety in the configurations of chips that are available does not always lend itself to making a uniform receptacle in that there may be varying numbers of pins and various arrays of pins. The heretofore known receptacles have generally been useful only for single IC chip configurations and they are not readily adaptable for expansion and/or revision.

SUMMARY OF THE INVENTION

The present invention overcomes the difficulties of the prior available receptacles by providing four identical molded modules of rigid insulative material which fit together to make a single receptacle housing thus reducing the molding costs while adding versatility to the configuration of the housing. The four identical housing modules interlock to form a complete receptacle connector and each module is loaded with a plurality of receptacle contacts each positioned to receive a respective lead of the IC chip carrier.

BRIEF DESCRIPTION OF THE DRAWINGS

An embodiment of the present invention will now be described by way of example with reference to the accompanying drawings in which:

FIG. 2 is a perspective view, partly in section and partly broken away, showing the receptacle of the present invention receiving an IC chip carrier therein;

FIG. 3 is a partial transverse section taken along line 3—3 of FIG. 2; and

FIG. 4 is a perspective view of a receptacle pin of the type used in the present invention.

DETAILED DESCRIPTION OF THE PREFERRED EMBODIMENT

Figure 1:
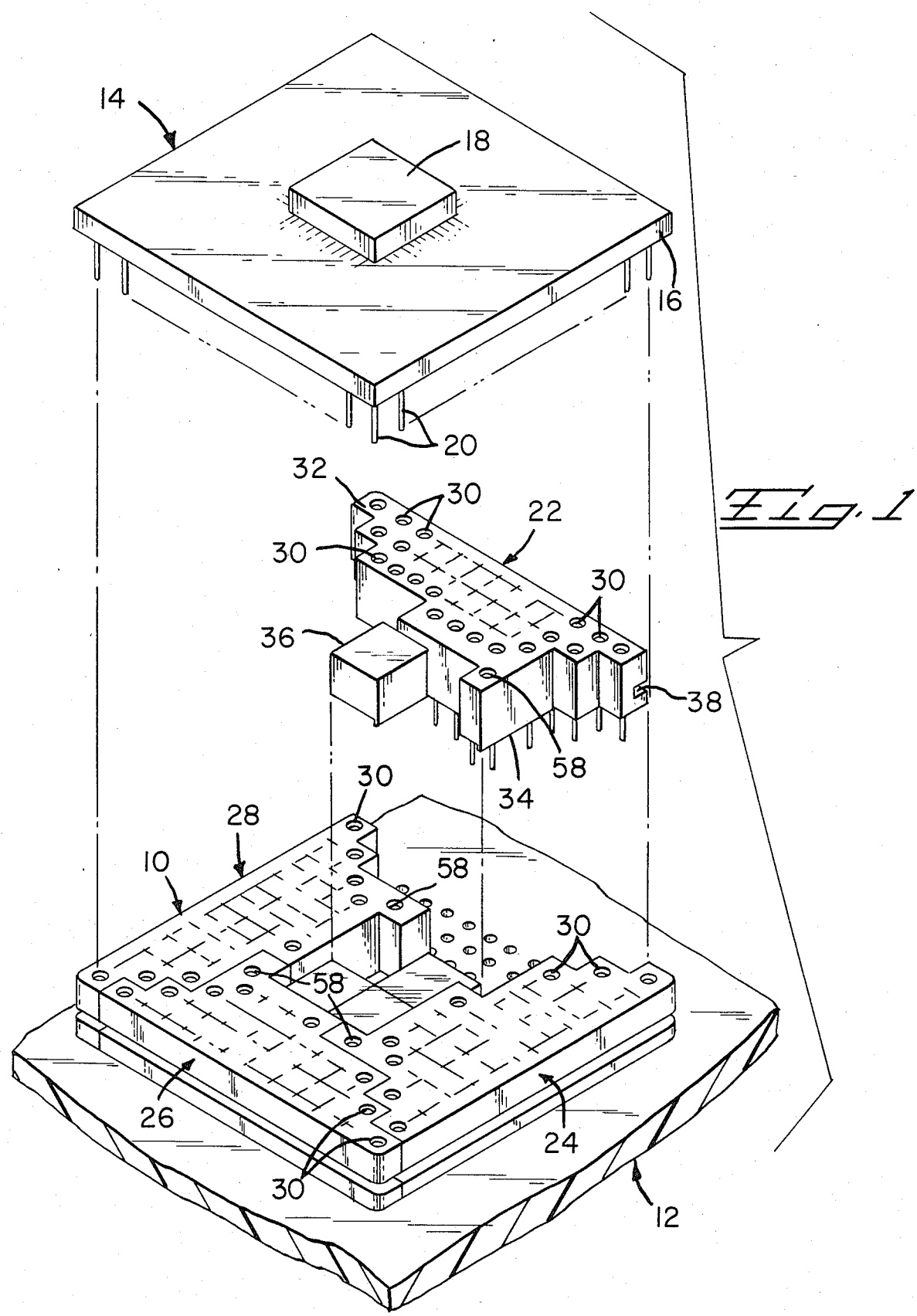
FIG. 1 is a perspective view showing a chip carrier exploded from a partially exploded modular receptacle connector according to the present invention.

Referring to FIGS. 1-4 the subject receptacle connector 10 is mounted on a known circuit board or the like 12 and receives therein a known integrated circuit chip carrier 14.

The chip carrier 14 is typically a square of ceramic 16 having an integrated circuit chip 18,18' mounted on either the upper or lower surface thereof and with a plurality of pins 20 connected to the chip and depending from the carrier in a spaced array. Usually the pins depend from near the marginal portions of the module 16.

The receptacle 10 is formed by four identical modules 22, 24, 26, 28 each of which is formed from rigid insulative material and has a plurality of contact passages 30 extending between a mating face 32 and a mounting face 34. Each module has, at the end portions thereof, an inwardly directed stepped profile, each step corresponding to a row of passages 30. At the innermost end of the module there is a keying block 36 which is also recessed from the mating surface 32 so as to accommodate a chip 18 mounted on the bottom side of the carrier module 16. Each module also has an outwardly directed slot 38 on the outer marginal edge thereof.

A plurality of receptacle terminals 40 are provided, each mounted in a respective passage 30. Each terminal 40 has an elongated receptacle portion 42, here shown as a generally cylindrical shape with at least two opposed spring arms 44 formed from the sides thereof to extend into the barrel portion of the receptacle so as to make a wiping engagement with pin terminals 20 inserted therein. Side portions of the receptacle portion are coined at 48 so as to provide an anti-overstress feature for the cantilever spring arms 44. Each terminal 40 is also provided with at least one lance 50 for making an interference fit with the inside rows of the passages 30 or a snap fit into slot 38 on the outside rows as best seen in FIG. 3. Each terminal 40 is also provided with a mounting tail 52 which is profiled to be received in a plated hole 54 of the circuit board 12. This mounting tail 52 can be formed in any one of many configurations, such as a compliant pin section or with a simpler section adopting it for solder mounting to the circuit board.

It will be noted from FIG. 3 that the carrier 14 is also provided with at least one keying pin 56 which is received in the appropriate keying passage 58 of the receptacle connector to properly align the chip carrier thereon.

It will be appreciated by those skilled in the art that the present housing, by its interlocking configuration, can be readily expanded to accommodate a wide variety of pin arrangements. For example, four modules of 33 positions could be interlocked to form a 132 position pin grid array receptacle. Simply by making minor adjustments to the mold, housing modules could be molded having higher pin counts and assembled to form higher pin count receptacles.

We claim:

1. A modular receptacle receiving a high density array of pin terminals from an integrated chip carrier, the receptacle having a mating face and an opposite directed mounting face with a plurality of terminal passages extending there between in parallel spaced rows, a like plurality of receptacle terminals, each terminal mounted in a respective passage and having a receptacle pin engaging portion directed toward said mating face, and a mounting portion extending from the mounting face contacting a conductive portion of a circuit board characterized in that said receptacle is formed by four intermating modules of insulative material, each module having a longer outer side and a shorter inner side connected at opposite ends, by stepped end profiles, each step of each end profile corresponding to a row of passages, and a keying block recessed from said mating face and extending from the inner side of each said module whereby said modules are interfitted by said stepped end profiles with the recessed keying blocks forming a cavity to receive a chip of a chip carrier therein.

2. A modular receptacle according to claim 1 further characterized by at least one keying aperture in each said module positioning to receive a respective keying pin of said carrier.

3. A modular receptacle according to claim 1 further characterized by said keying blocks interfitting to hold said receptacle together.

4. Modules forming an integrated circuit receptacle, each said module comprising a unitary member of rigid insulative material having a mating surface and an oppositely directed mounting surface, a plurality of terminal passages extending between said surfaces and aligned in at least one row, a longer outer side and a shorter inner side connected at opposite ends by stepped configurations, each step being associated with a corresponding row of passages, and a keying block extending from the shorter inner side of each said module, whereby four of said modules are assembled to form a single receptacle with said steps and said keying blocks interfitting.

5. Modules according to claim 4 further comprising a receptacle terminal in each said passage, each terminal having a receptacle portion directed toward said mating face and a mounting portion extending from said mounting face.

* * * * *